(12) United States Patent
Miyahara et al.

(10) Patent No.: US 8,394,709 B2
(45) Date of Patent: Mar. 12, 2013

(54) PROCESS FOR PRODUCING PHOTOVOLTAIC DEVICE AND DEPOSITION APPARATUS

(75) Inventors: Hiroomi Miyahara, Nagasaki (JP); Kengo Yamaguchi, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 4 days.

(21) Appl. No.: 13/124,553

(22) PCT Filed: Oct. 2, 2009

(86) PCT No.: PCT/JP2009/067244
§ 371 (c)(1),
(2), (4) Date: Apr. 15, 2011

(87) PCT Pub. No.: WO2010/100782
PCT Pub. Date: Sep. 10, 2010

(65) Prior Publication Data
US 2011/0201145 A1  Aug. 18, 2011

(30) Foreign Application Priority Data
Mar. 6, 2009 (JP) .................................. 2009-053465

(51) Int. Cl.
*H01L 21/00* (2006.01)
(52) U.S. Cl. ................... 438/485; 438/87; 118/723 R
(58) Field of Classification Search ........... 438/485, 438/87, 507; 118/723 R, 723 E, 712
See application file for complete search history.

(56) References Cited

U.S. PATENT DOCUMENTS

| 6,224,950 B1 | 5/2001 | Hirata |
| 6,274,461 B1 | 8/2001 | Guha et al. |
| 6,620,247 B2 * | 9/2003 | Ebe et al. ................. 118/689 |
| 2005/0164474 A1 | 7/2005 | Guha et al. |

FOREIGN PATENT DOCUMENTS

| JP | S60-257516 | 12/1985 |
| JP | S62-093382 | 4/1987 |
| JP | H11-074201 | 3/1999 |
| JP | 2000-174310 | 6/2000 |
| JP | 2002-246317 | 8/2002 |

* cited by examiner

*Primary Examiner* — Charles Garber
*Assistant Examiner* — Reema Patel
(74) *Attorney, Agent, or Firm* — Manabu Kanesaka; Benjamin J. Hauptman; Kenneth M. Berner

(57) ABSTRACT

A process for producing a high-performance photovoltaic device by depositing a high-quality crystalline silicon layer, and a deposition apparatus for depositing the high-quality crystalline silicon layer. A process for producing a photovoltaic device that comprises forming a crystalline silicon-based photovoltaic layer comprising an i-layer on a substrate using a plasma-enhanced CVD method, wherein formation of the i-layer comprises an initial layer deposition stage and a bulk i-layer deposition stage, and the initial layer deposition stage comprises depositing the initial layer using a silane-based gas flow rate during the initial layer deposition stage that is lower than the silane-based gas flow rate during the bulk i-layer deposition stage, with the deposition time for the initial layer deposition stage set to not less than 0.5% and not more than 20% of the total deposition time for the i-layer, and with the SiH* emission intensity during the initial layer deposition stage not, more than 80% of the stabilized SiH* emission intensity during the bulk i-layer deposition stage.

7 Claims, 9 Drawing Sheets

(a)

(b)

PROCESS FOR PRODUCING PHOTOVOLTAIC DEVICE AND DEPOSITION APPARATUS

RELATED APPLICATIONS

The present application is National Phase of International Application No. PCT/JP2009/067244 filed Oct. 2, 2009, and claims priority from Japanese Application No, 2009-053465, filed Mar. 6, 2009, the disclosure of which is hereby incorporated by reference herein in its entirety.

TECHNICAL FIELD

The present invention relates to a process for producing a photovoltaic device, and relates particularly to a process for producing a thin-film solar cell in which the electric power generation layer is formed by deposition, and a deposition apparatus used in the deposition of the electric power generation layer.

BACKGROUND ART

One known example of a photovoltaic device that converts the energy from sunlight, into electrical energy is a thin-film silicon-based solar cell comprising a photovoltaic layer formed by using a plasma-enhanced CVD method or the like to deposit thin films of a p-type silicon-based semiconductor (p-layer), an i-type silicon-based semiconductor (i-layer) and an n-type silicon-based semiconductor (n-layer). Among thin-film silicon-based solar cells, tandem-type solar cells in which a photovoltaic layer comprising an i-layer composed of amorphous silicon (an amorphous silicon i-layer) and a photovoltaic layer comprising an i-layer composed of crystalline silicon (a microcrystalline silicon i-layer) are stacked together are being used to improve the conversion efficiency.

In order to improve the conversion efficiency of a thin-film silicon-based solar cell, improving the quality of the crystalline silicon layer, and particularly the crystalline silicon i-layer, is absolutely vital. Further, because the crystalline silicon i-layer is thicker than the other layers, it is desirable that the crystalline silicon i-layer is deposited at a rapid rate, thereby improving the productivity of the solar cell.

Patent Literature 1 discloses a deposition process wherein during the deposition of a crystalline silicon photovoltaic layer, following deposition of 30% of the layer, the silane-based gas flow rate is gradually increased so that at the completion of deposition, the flow rate is 1.1 to 1.5 times the initial flow rate. According to this process, the deposition rate can be increased in accordance with the increased silane-based gas flow rate, and the open-circuit voltage of the resulting photovoltaic device can be increased.

Patent Literature 2 discloses that for deposition of a microcrystalline silicon semiconductor layer at a given hydrogen dilution ratio, increasingly coarse particles are grown as the thickness of the layer is increased, resulting in a reduction in the performance. Accordingly, in Patent Literature 2, during deposition of the microcrystalline silicon semiconductor layer, the hydrogen dilution ratio (silane flow rate) is increased in a stepwise manner through 5 stages from the start of deposition through to the completion of deposition, thereby improving the film quality and increasing the open-circuit voltage.

CITATION LIST

Patent Literature

{PTL 1}: Publication of Japanese Patent No. 3,672,754 (claim 1, paragraphs [0021] and [0039])

{PTL 2}); U.S. Patent Application No 2005/0164474 specification (paragraphs [0014], [0018] and [0033], FIG. 1 and Table 2)

SUMMARY OF INVENTION

Technical Problem

As described above, by forming a crystalline silicon thin film by altering the silane-based gas flow rate so that the flow rate increases from the start of deposition through to the completion of deposition, the open-circuit voltage of the photovoltaic device can be increased, and the photovoltaic conversion efficiency can be improved. According to the disclosures within PTL 1 and PTL 2, in order to achieve this open-circuit voltage improvement effect, the deposition time required for the initial deposition is set to a significantly long period, and for example in PTL 1, is set to 30% of the total deposition time. However, under the type of slow deposition conditions described in PTL 1 and PTL 2, lengthening the initial deposition period when the silane-based gas flow rate is small (meaning the deposition rate is slower) causes a lengthening of the deposition time for the thick crystalline silicon i-layer, leading to a deterioration in productivity.

Further, when a crystalline silicon layer is formed on a large surface area substrate with a surface area exceeding 1 $m^2$, distributions tend to develop in the open-circuit voltage and conversion efficiency within the substrate plane as a result of factors such as the as distribution within the substrate plane. The fact that these distributions tend to develop more readily when the crystalline silicon layer is deposited at a rapid rate (for example, 1.5 to 2.5 nm/sec) has become a significant problem.

The present invention provides a process for producing a high-performance photovoltaic device by depositing a high-quality crystalline silicon layer, and also provides a deposition apparatus for depositing the high-quality crystalline silicon layer.

Solution to Problem

The present invention provides a process for producing a photovoltaic device that comprises forming a crystalline silicon-based photovoltaic layer comprising an i-layer on a substrate using a plasma-enhanced CVD method, wherein formation of the i-layer comprises an initial layer deposition stage and a bulk i-layer deposition stage, and the initial layer deposition stage comprises depositing the initial layer using a silane-based gas flow rate during the initial layer deposition stage that is lower than the silane-based gas flow rate during the bulk i-layer deposition stage, with the deposition time for the initial layer deposition stage set to not less than 0.5% and not more than 20% of the total deposition time for the i-layer, and with the SiH* emission intensity during the initial layer deposition stage not more than 80% of the stabilized SiH* emission intensity during the bulk i-layer deposition stage.

Investigation of the plasma emission intensity during deposition of a crystalline silicon i-layer using a plasma-enhanced CVD method revealed that the SiH* emission intensity was high immediately following plasma generation (immediately following the start of deposition), but than decreased rapidly over a subsequent period of approximately 100 seconds. In other words, it is surmised that for approximately 100 seconds immediately following plasma generation, the balance between supply and consumption of the silane-based as is poor, and the plasma is unstable. It is thought that as deposition is continued, the SiH* emission intensity adopts a substantially constant value, and the plasma stabilizes.

Accordingly, in the process for producing a photovoltaic device according to the present invention, the formation of the crystalline silicon i-layer is split into a two-stage deposition composed of an initial layer deposition stage and a bulk i-layer deposition stage. The initial layer is deposited during the period described above when the plasma is unstable (namely, the period of approximately 100 seconds immediately following plasma generation). At this time, by depositing the initial layer under conditions including a lower silane-based gas flow rate than that used during deposition of the bulk i-layer, the SiH* emission intensity can be reduced and the plasma can be stabilized, and as a result, a high-quality initial layer (base layer) is formed. Because a high-quality initial layer improves crystal growth of the bulk i-layer in the thickness direction, the quality of the overall i-layer improves, and the open-circuit voltage increases. The deposition time for the initial layer as a percentage of the total deposition time for the overall i-layer varies depending on the i-layer thickness and the deposition rate, but in the present invention, is set to a deposition time that is not less than 0.5% and not more than 20% of the total deposition time for the i-layer. In this manner, by lowering the silane-based gas flow rate for only the short period immediately following the start of deposition to for the initial layer, and subsequently forming the bulk i-layer, the electric power output of the photovoltaic device can be increased without lowering the productivity.

Furthermore, the silane-based gas concentration inside the deposition chamber exhibits a proportional relationship with the SiH* emission intensity. In the present invention, the silane-based gas flow rate supplied to the deposition chamber during the initial layer deposition stage is adjusted so that the SiH* emission intensity during, deposition of the initial layer is not more than 80% of the stabilized SiH* emission intensity during deposition of the bulk i-layer. By performing deposition of the initial layer with the SiH* emission intensity set to a value that satisfies the above range, the balance between supply and consumption of the silane-based gas is optimized and the plasma is stabilized enabling the formation of an initial layer of favorable quality. As a result, the quality of the overall i-layer improves, the open-circuit voltage of the photovoltaic device increases, and the electric power output increases.

In the present invention described above, the initial layer is preferably deposited with the silane-based gas flow rate during the initial layer deposition stage set to a value that is not less than 20% and not more than 65% of the silane-based gas flow rate during the bulk i-layer deposition stage.

The silane-based gas flow rate during deposition of the initial layer is determined with due consideration of the need to ensure a level of quality that enables favorable crystal growth of the bulk i-layer that is formed on top of the initial, layer, and so that the deposition rates for the initial layer and the bulk i-layer enable a favorable level of productivity to be maintained. The optimum, value for the ratio of the silane-based gas flow rate during deposition of the initial layer relative to the silane-based gas flow rate during deposition of the bulk i-layer varies depending on the silane-based gas flow rate used during deposition of the bulk i-layer, but in the present invention, by employing the ratio described above, the electric power output of the photovoltaic device can be improved.

In the present invention described above, the i-layer is preferably deposited under conditions including a reduced pressure atmosphere of not more than 3,000 Pa and a plasma generation frequency of not less than 40 MHz and not more than 100 MHz.

The present invention described above preferably comprises: forming a transparent electrode layer on the substrate, forming a first cell layer by sequentially stacking a p-layer, an i-layer and an n-layer containing mainly amorphous silicon on top of the transparent electrode layer, forming an intermediate contact layer containing mainly a transparent conductive oxide on top of the first, cell layer, forming a second cell layer by sequentially stacking a p-layer, the above-mentioned i-layer and an n-layer containing mainly crystalline silicon on top of the intermediate contact layer, and forming a back electrode layer on top of the second cell layer. In a photovoltaic device having two cell layers as the photovoltaic layer, the present invention is particularly effective in improving the quality of the crystalline silicon i-layer.

Particularly in those cases where the deposition rate is set to 1.5 nm/s or higher, and those cases where a large surface area substrate at 1 $m^2$ or greater is used, the occurrence of a distribution in the silane-based gas flow rate within the substrate plane increases the likelihood of distributions developing in the open-circuit voltage and the electric power output within the substrate plane. In the process for producing a photovoltaic device described above, by forming the initial layer in a short period of time under conditions including a low silane-based gas flow rate, the balance between supply and consumption of the silane-based gas during deposition of the initial layer is optimized, and the performance of the photovoltaic device within the substrate plane can be equalized.

A deposition apparatus according to the present invention is a deposition apparatus that uses a plasma-enhanced CVD method to deposit a crystalline silicon-based photovoltaic layer comprising an i-layer composed of an initial layer and a bulk i-layer, the apparatus comprising at least a deposition chamber, a silane-based gas supply unit that supplies a silane-based gas to the deposition chamber, an emission intensity measurement unit that measures the SiH* emission intensity during deposition of the i-layer, and a gas flow rate control unit that controls the silane-based gas flow rate supplied from the silane-based gas supply unit so that the SiH* emission intensity during deposition of the initial layer, as measured by the emission intensity measurement unit, adopts a predetermined value.

In the deposition apparatus of the present invention, the silane-based gas flow rate during deposition of the initial layer may be adjusted so that the SiH* emission intensity during deposition of the initial layer satisfies a predetermined ratio relative to the SiH* emission intensity during deposition of the bulk i-layer. Because the silane-based as flow rate during the initial stage of deposition of the crystalline silicon i-layer is adjusted, enabling the plasma to be stabilized, a high-quality crystalline silicon i-layer can be deposited.

Advantageous Effects of Invention

In the process for producing a photovoltaic device according to the present invention, by lowering the silane-based gas flow rate during the initial deposition, a balance can be achieved between supply and consumption of the silane-based gas, enabling the plasma to be stabilized. Consequently, a high-quality initial layer can be formed, and crystal growth of the bulk i-layer in the thickness direction is improved. In other words, the quality of the overall crystalline silicon i-layer is improved. As a result, the produced photovoltaic device exhibits an increased open circuit voltage and a high electric power output. Further, because the initial layer is deposited within a short period of time, the crystalline silicon i-layer can be deposited with no reduction in productivity.

The deposition apparatus of the present invention adjusts the silane-based gas flow rate during deposition of the initial layer so that the SiH* emission intensity during deposition of the initial layer adopts a predetermined ratio relative to the SiH* emission intensity during deposition of the bulk i-layer, and therefore the plasma can be stabilized during deposition of the initial layer. As a result, a crystalline silicon i-layer of favorable quality can be deposited.

DESCRIPTION OF EMBODIMENTS

Figure 1:
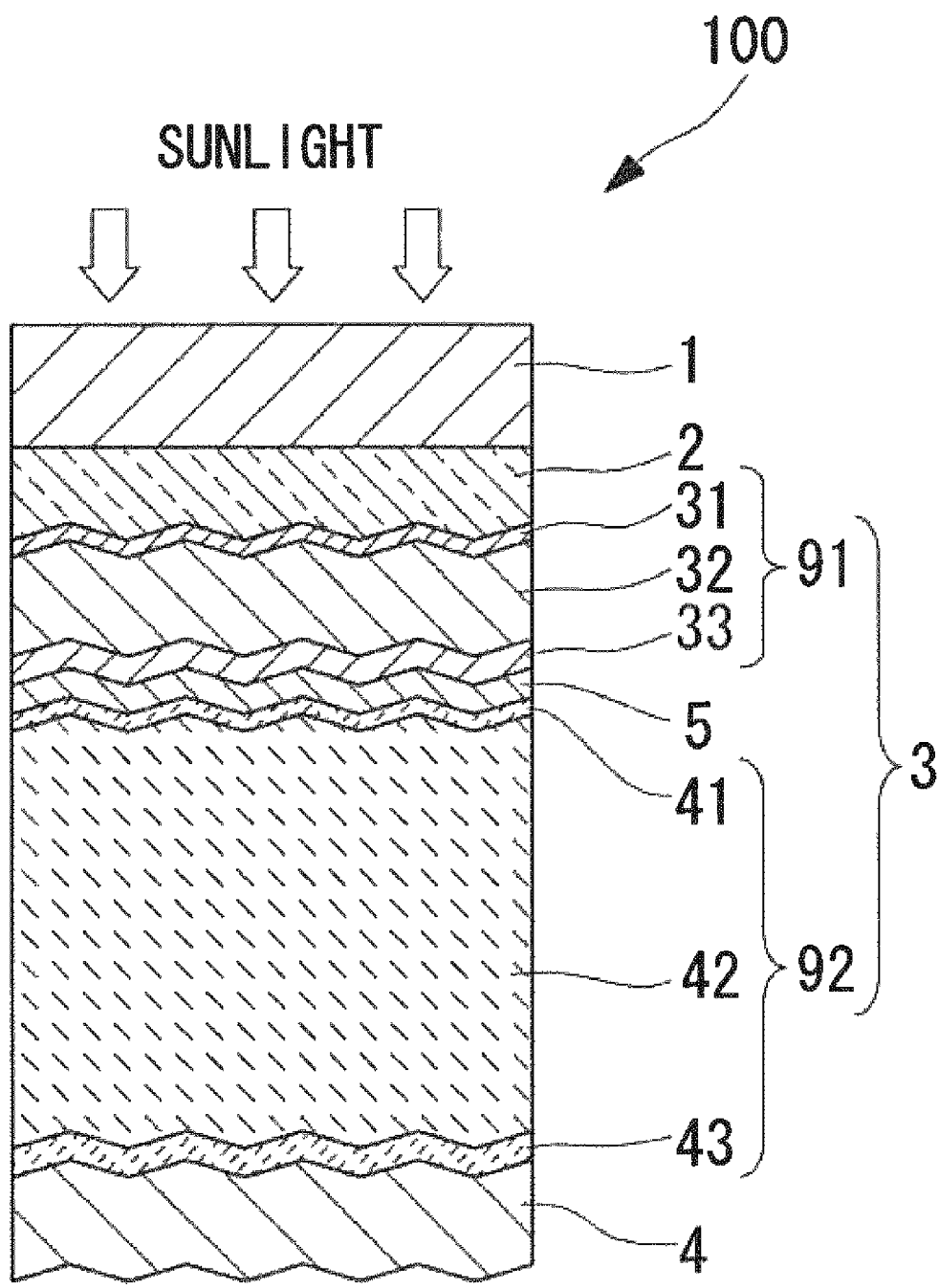
FIG. 1 A schematic view illustrating the structure of a photovoltaic device produced using the process for producing a photovoltaic device according to the present invention.
Figure 2:
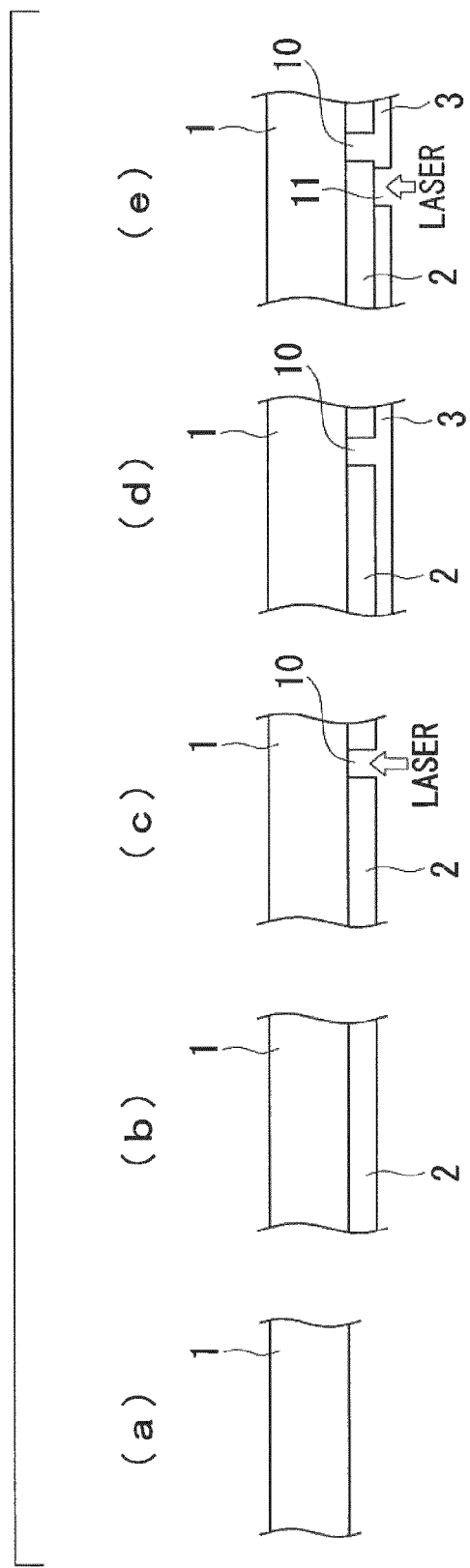
FIG. 2 A schematic illustration describing an embodiment for producing a solar cell, panel using the process for producing a photovoltaic device according to the present invention.
Figure 3:
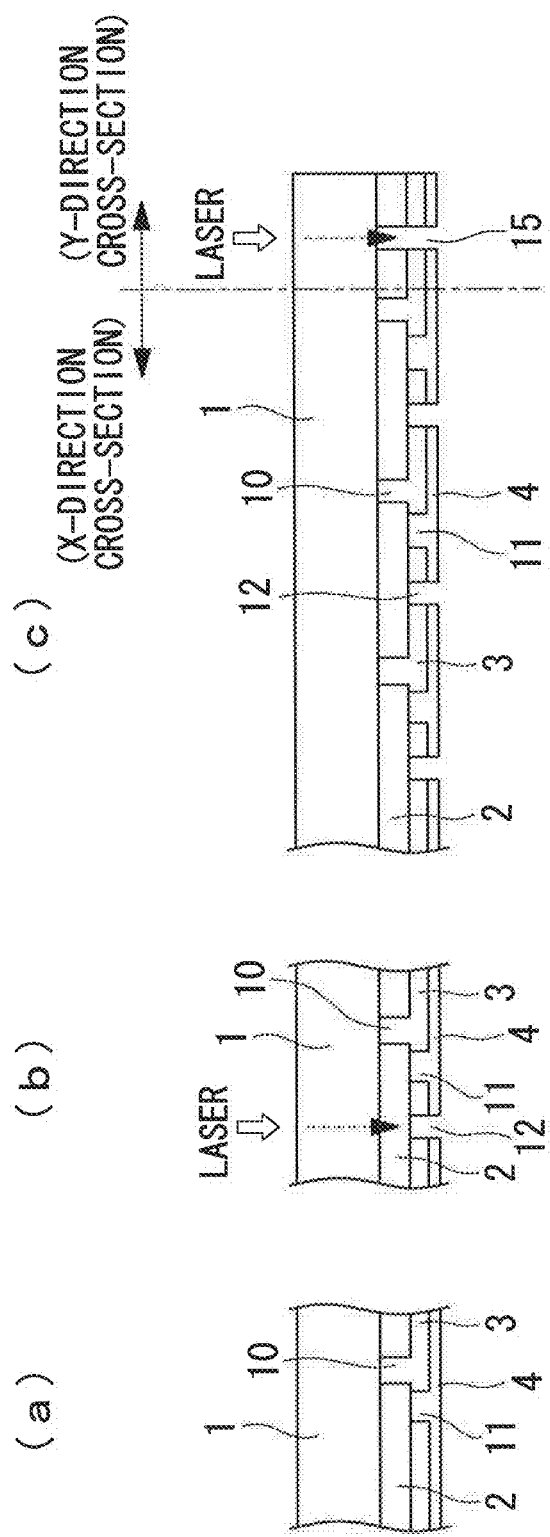
FIG. 3 A schematic illustration describing an embodiment for producing a solar cell panel using the process for producing a photovoltaic device according to the present invention.

FIG. 1 is a schematic view illustrating the structure of a photovoltaic device according to the present invention. The photovoltaic device 100 is a tandem-type silicon-based solar cell, and comprises a substrate 1, a transparent electrode layer 2, a first, cell layer 91 (an amorphous silicon series) and a second cell layer 92 (a crystalline silicon series) as a solar cell photovoltaic layer 3, an intermediate contact layer 5, and a back electrode layer 4. Here, the terms "silicon based" and "silicon series" are generic terms that include silicon (Si), silicon carbide (Sic) and silicon germanium (SiGe). Further, a crystalline silicon series describes a silicon series other than an amorphous silicon series, and includes both microcrystalline silicon series and polycrystalline silicon series.

A description of the process for producing a photovoltaic device according to the present embodiment is presented below, using the steps for producing a solar cell panel as an example. FIG. 2 to FIG. 5 are schematic views illustrating the process for producing a solar cell, panel according to this embodiment.

(1) FIG. 2(a)

A soda float glass substrate with a surface area of at least 1 $m^2$ (for example with dimensions of 1.4 m×1.1 m×thickness: 3.5 to 4.5 mm) is used as the substrate 1. The edges of the substrate are preferably subjected to corner chamfering or R-face chamfering to prevent damage caused by thermal stress or impacts or the like.

(2) FIG. 2(b)

A transparent electrode film comprising mainly tin oxide ($SnO_2$) and having a film thickness of approximately not less than 500 nm and not more than 800 nm is deposited as the transparent electrode layer 2, using a thermal CVD apparatus at a temperature of approximately 500° C. During this deposition, a texture comprising suitable unevenness is formed on the surface of the transparent electrode film. In addition to the transparent electrode film, the transparent electrode layer 2 may include an alkali barrier film (not shown in the figure) formed between the substrate 1 and the transparent electrode film. The alkali barrier film is formed using a thermal. CVD apparatus at a temperature of approximately 500° C. to deposit a silicon oxide film ($SiO_2$) having a film thickness of 50 nm to 150 nm.

(3) FIG. 2(c)

Subsequently, the substrate 1 is mounted on an X-Y table, and the first harmonic of a YAG laser (1064 nm) is irradiated onto the surface of the transparent electrode film, as shown by the arrow in the figure. The laser power is adjusted to ensure an appropriate process speed, and the transparent electrode film is then moved in a direction perpendicular to the direction of the series connection of the electric power generation cells, thereby causing a relative movement between the substrate 1 and the laser light, and performing laser etching across a strip having a predetermined width of approximately 6 mm to 15 mm to form a slot 10.

(4) FIG. 2(d)

Using a plasma-enhanced CVD apparatus, a p-layer, an i-layer and an n-layer, each composed of a thin film of amorphous silicon, are deposited as the first cell layer 91. Using a silane-based gas such as $SiH_4$ gas) and $H_2$ gas as the main raw materials, and under conditions including a reduced pressure atmosphere of not less than 30 Pa and not more than 1,000 Pa and a substrate temperature of approximately 200° C., an amorphous silicon p-layer 31, an amorphous silicon i-layer 32 and an amorphous silicon n-layer 33 are deposited, in that order, on the transparent electrode layer 2 with the p-layer closest to the surface from which incident sunlight enters. The amorphous silicon p-layer 31 comprises mainly amorphous B-doped silicon, and has is thickness of not less than 10 nm and not more than 30 nm. The amorphous silicon i-layer 32 has a thickness of not less than 200 nm and not more than 350 nm. The amorphous silicon n-layer 33 comprises mainly P-doped silicon in which microcrystalline silicon is incorporated within amorphous silicon, and has a thickness of not less than 30 nm and not more: than 50 nm, A buffer layer may be provided between the amorphous silicon p-layer 31 and the amorphous silicon i-layer 32 in order to improve the interface properties.

Next, using a plasma-enhanced CVD apparatus and under conditions including a reduced pressure atmosphere of not more than 3,000 Pa, a substrate temperature of approximately 200° C. and a plasma generation frequency of not less than 40 MHz and not more than 100 MHz, a crystalline silicon p-layer 41, a crystalline silicon i-layer 42 and a crystalline silicon layer 43 are deposited, in that order, as the second cell layer 92 on top of the first cell layer 91. The crystalline silicon p-layer 41 comprises mainly B-doped microcrystalline silicon, and has a thickness of not less than 10 nm and not more than 50 nm. The crystalline silicon i-layer 42 comprises mainly microcrystalline silicon, and has a thickness of not less than 1.2 μm and not more than 3.0 μm. The crystalline silicon n-layer 43 comprises mainly P-doped microcrystalline silicon, and has a thickness of not less than 10 nm and not more than 50 nm. The crystalline silicon n-layer 43 may be replaced with a layer containing mainly P-doped amorphous silicon.

During formation of the i-layer film comprising mainly microcrystalline silicon using a plasma-enhanced CVD method, a distance d between the plasma discharge electrode and the surface of the substrate 1 is preferably not less than 3 mm and not more than 10 mm. If this distance d is less than 3 mm, then the precision of the various structural components within the film deposition chamber required for processing large substrates means that maintaining the distance d at a constant value becomes difficult, which increases the possibility of the electrode getting too close and making the discharge unstable. If the distance d exceeds 10 mm, then achieving a satisfactory deposition rate becomes difficult, and the uniformity of the plasma also deteriorates, causing a deterioration in the quality of the film due to ion impact.

The intermediate contact layer 5, which functions as a semi-reflective film for improving the contact properties and achieving electrical current consistency, is provided between the first cell layer 91 and the second cell layer 92. A GZO (Ga-doped ZnO) film with a thickness of not less than 20 nm and not more than 100 nm may be deposited as the intermediate contact layer 5 using a sputtering apparatus with a Ga-doped ZnO sintered body as the target. Further, in some cases the contact layer 5 need not be provided.

(5) FIG. 2(e)

The substrate 1 is mounted on an X-Y table, and the second harmonic of a laser diode excited YAG laser (532 nm) is irradiated onto the surface of the photovoltaic layer 3, as shown by the arrow in the figure. With the pulse oscillation set to 10 kHz to 20 kHz, the laser power is adjusted so as to achieve a suitable process speed, and laser etching is performed at a point approximately 100 μm to 150 μm to the side of the laser etching line within the transparent electrode layer 2, so as to form a slot 11. The laser may also be irradiated from the side of the substrate 1, and in this case, because the high vapor pressure generated by the energy absorbed by the amorphous silicon-based first cell layer 91 of the photovoltaic layer 3 can be utilized in etching the photovoltaic layer 3, more stable laser etching processing can be performed. The position of the laser etching line is determined with due consideration of positioning tolerances, so as not to overlap with the previously formed etching line.

(6) FIG. 3(a)

Using a sputtering apparatus, an Ag film and a Ti film are deposited as the back electrode layer 4 under a reduced pressure atmosphere and at a deposition temperature of approximately 150° C. to 200° C. In this embodiment, an Ag film having a thickness of not less than 150 nm and not more than 500 nm, and a highly corrosion-resistant Ti film having a thickness of not less than 10 nm and not more than 20 nm which acts as a protective film for the Ag film are stacked in that order. Alternatively, the back electrode layer 4 may be formed as a stacked structure composed of an Ag film having a thickness of 25 nm to 100 nm, and an Al film having a thickness of 15 nm to 500 nm. In order to reduce the contact resistance between the crystalline silicon n-layer 43 and the back electrode layer 4 and improve the reflectance, a GZO (Ga-doped ZnO) film with a thickness of not less than 50 nm and not more than 100 nm may be deposited between the photovoltaic layer 3 and the back electrode layer 4 using a sputtering apparatus.

(7) FIG. 3(b)

The substrate 1 is mounted on an X-Y table, and the second harmonic of a laser diode excited YAG laser (532 nm) is irradiated through the substrate 1, as shown by the arrow in the figure. The laser light is absorbed by the photovoltaic layer 3, and by utilizing the high gas vapor pressure in at this point, the back electrode layer 4 removed by explosive fracture. With the pulse oscillation set to not less than 1 kHz and not more than 10 kHz, the laser power is adjusted so as to achieve a suitable process speed, and laser etching is performed at a point approximately 250 μm to 400 μm to the side of the laser etching line within the transparent electrode layer 2, so as to form a slot 12.

(8) FIG. 3(c) and FIG. 4(a)

Peripheral film removal processing is then performed to prevent short circuits within the laser etched portions near the edges of the substrate. The substrate 1 is mounted on an X-Y table, and the second harmonic of a laser diode excited YAG laser (532 nm) is irradiated through the substrate 1. The laser light is absorbed by the transparent electrode layer 2 and the photovoltaic layer 3, and by utilizing the high gas vapor pressure generated at this point, the back electrode layer 4 is removed by explosive fracture, and the back electrode layer 4, the photovoltaic layer 3 and the transparent electrode layer 2 are removed. With the pulse oscillation set to not less than 1 kHz and not more than 10 kHz, the laser power is adjusted so as to achieve a suitable process speed, and laser etching is performed at a point approximately 5 mm to 20 mm from the edge of the substrate 1, so as to form an X-direction insulation slot 15 as illustrated in FIG. 3(c). FIG. 3(c) represents an X-direction cross-sectional view cut along the direction of the series connection of the photovoltaic layer 3, and therefore the location in the figure where the insulation slot 15 is formed should actually appear as a peripheral film removed region 14 in which the back electrode layer 4, the photovoltaic layer 3 and the transparent electrode layer 2 have been removed by film polishing (see FIG. 4(a)), but in order to facilitate description of the processing of the edges of the substrate 1, this location in the figure represents a Y-direction cross-sectional view, so that the formed insulation slot represents an X-direction insulation slot 15. A Y-direction insulation slot need not be provided at this point, because a film surface polishing and removal treatment is performed on the peripheral film removal regions of the substrate 1 in a later step.

Completing the etching of the insulation slot 15 at a position 5 mm to 15 mm from the edge of the substrate 1 is preferred, as it ensures that the insulation slot 15 is effective in inhibiting external moisture from entering the interior of the solar cell module 6 is the edges of the solar cell panel.

Although the laser light used in the steps until this point has been specified as YAG laser light, light from a YVO4 laser or fiber laser or the like may also be used in a similar manner.

Figure 4:
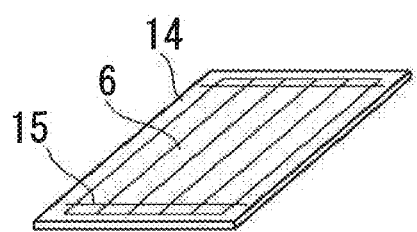
FIG. 4 A schematic illustration describing an embodiment for producing a solar cell panel using the process for producing a photovoltaic device according to the present invention.
Figure 4:
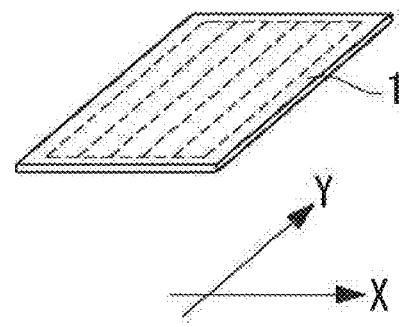
Figure 5:
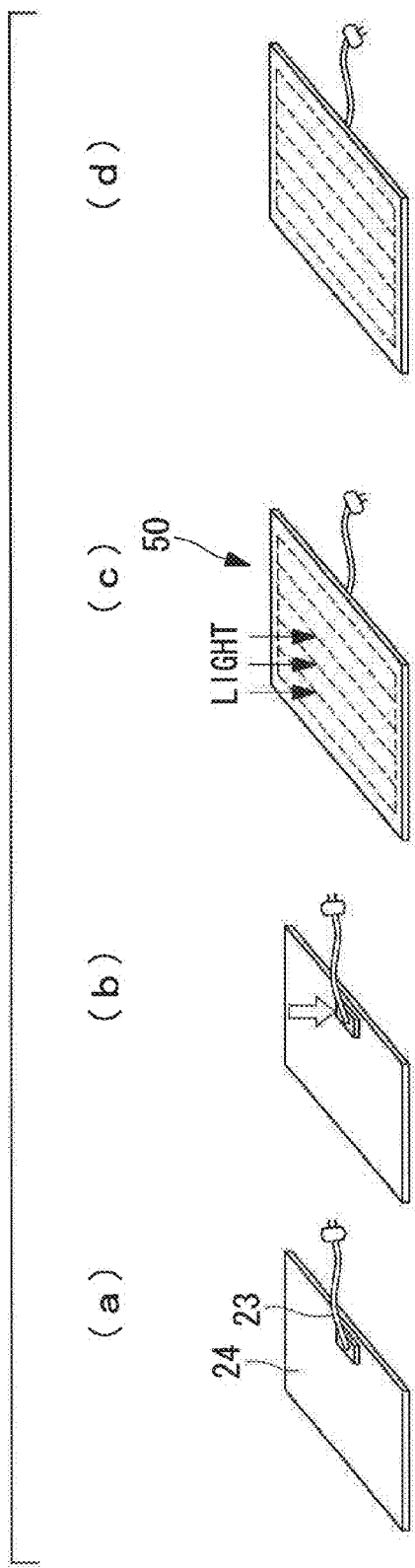
FIG. 5 A schematic illustration describing an embodiment for producing a solar cell panel using the process for producing a photovoltaic device according to the present invention.

(9) FIG. 4 (a: View from Solar Cell Film Surface Side, B: View from Substrate Side of Light Incident Surface)

In order to ensure favorable adhesion and sealing of a backing sheet 24 via EVA or the like in a subsequent step, the stacked films around the periphery of the substrate 1 (in a peripheral film removal region 14), which tend to be uneven and prone to peeling, are removed to form a peripheral film removed region 14. During removal of the films from a region that is 5 mm to 20 mm from the edge around the entire periphery of the substrate 1, grinding or blast polishing or the like is used to remove the back electrode layer 4, the photovoltaic layer 3 and the transparent electrode layer 2 from a region that is closer to the substrate edge in the X direction than the insulation slot 15 provided in the above step of FIG. 3(c), and closer to the substrate edge in the Y direction than the slot 10 provided near the substrate edge.

Grinding debris or abrasive grains are removed by washing the substrate 1.

(10) FIG. 5(a) (b)

An attachment portion for a terminal box 23 is prepared by providing an open through-window in the hacking sheet 24 to expose a collecting plate. A plurality of layers of an insulating material are provided in this open through-window portion in order to prevent external moisture and the like entering the solar cell module.

Processing is conducted so as to enable current collection, using a copper foil, from the series-connected solar cell electric power generation cell at one end, and the solar cell electric power generation cell at the other end, in order to enable electric power to be extracted from the terminal box 23 on the rear surface of the solar cell panel. In order to prevent short circuits between the copper foil and the various portions, an insulating sheet that is wider than the with of the copper foil is provided.

Following arrangement of the collecting copper foil and the like at predetermined positions, the entire solar cell module 6 is covered with a sheet of an adhesive filling material such as EVA (ethylene-vinyl acetate copolymer), which is arranged so as not to protrude beyond the substrate 1.

A backing sheet 24 with a superior waterproofing effect is then positioned on top of the EVA. In this embodiment, in order to achieve a superior waterproofing and moisture-proofing effect, the backing sheet 24 is formed as a three-layer structure comprising a PST sheet, an Al foil and a PET sheet.

The structure comprising the components up to and including the backing sheet 24 arranged in predetermined positions is subjected to internal degassing under a reduced pressure atmosphere and under pressing at approximately 150° C. to 160° C. using a laminator, thereby causing cross-linking of the EVA that tightly seals the structure.

(11) FIG. 5(a)

The terminal box 23 is attached to the back of the solar cell module 6 using an adhesive.

(12) FIG. 5(b)

The copper foil and an output cable from the terminal box 23 are connected using solder or the like, and the interior of the terminal box 23 is filled and sealed with a sealant (a potting material). This completes the production of the solar cell panel 50.

(13) FIG. 5(c)

The solar cell panel 50 formed via the steps up to and including FIG. 5(b) is then subjected to an electric power generation test, as well as other tests for evaluating specific performance factors. The electric power generation test is conducted using a solar simulator that emits a standard sunlight of AM 1.5 (1,000 W/m$^2$).

(14) FIG. 5(d)

In tandem with the electric power generation test (FIG. 5(c)), a variety of specific performance factors including the external appearance are evaluated.

In this embodiment, the crystalline silicon i-layer 42 is composed of an initial layer and a bulk i-layer, with the initial layer being adjacent to the p-layer 41. Using a plasma-enhanced CVD method, the initial layer is deposited using a silane-based gas flow rate that is lower than that used for deposition of the bulk i-layer, and the silane-based gas flow rate is then increased for deposition of the bulk i-layer.

The bulk i-layer is deposited at a silane-based gas flow rate that not only yields favorable film quality, but also enables a deposition rate of at least 1.5 nm/s to be obtained. Under the type of high silane-based gas flow rate conditions used during deposition of the bulk i-layer, the SiH* emission intensity varies rapidly for approximately 100 seconds immediately following plasma generation, and the plasma is unstable. Particularly rapid variation is observed in the SiH* emission intensity for the 30 seconds immediately following plasma generation.

The SiH* emission intensity is proportional to the silane-based concentration inside the deposition chamber. In other words, by reducing the silane-based gas flow rate, the SiH* emission intensity can be reduced. As a result, a balance can be achieved between supply and consumption of the silane-based gas in the period immediately following plasma generation, enabling the plasma to be stabilized during the initial stage of deposition. Consequently, a high-quality initial layer can be formed as the base layer.

The initial layer deposition time may be set appropriately to the period during which the plasma is unstable (the approximately 100 seconds immediately following plasma generation), and particularly to the initial 30 seconds following the start of deposition (namely, immediately following plasma generation). Performing deposition of the initial layer for a period longer than the period for which the plasma is unstable yields no further plasma stabilizing effect, and because the silane-based gas flow rate during deposition of the initial layer is low, resulting in a slower deposition rate, the productivity tends to deteriorate.

The time period during which the plasma is unstable is substantially constant, and is independent of the total deposition time for the overall i-layer. On the other hand, the deposition time for the overall i-layer is determined by the thickness of the i-layer and the deposition rate. Accordingly, the ratio of the deposition time for the initial layer relative to the total deposition time for the i-layer varies in accordance with the total deposition time for the layer. For example, shortening the total deposition time for the i-layer causes a relative increase in the proportion of the deposition time for the initial layer. In this embodiment, the deposition time for the initial layer is set to not less than 0.5% and not more than 20%, preferably not less than 0.5% and not more than 10%, and still more preferably not less than 1.0% and not more than 5.0%, of the total deposition time for the overall i-layer.

The silane-based gas flow rate during deposition of the initial layer relative to the silane-based gas flow rate during deposition of the bulk i-layer varies depending on the silane-based gas flow rate during deposition of the bulk i-layer. For example, if the silane-based gas flow rate during deposition of the bulk i-layer is increased in order to increase the deposition rate, then the silane-based gas flow rate during deposition of the initial layer that is required to achieve a favorable bulk i-layer decreases relatively. Further, the ratio between the silane-based gas and hydrogen gas (the hydrogen dilution ratio) may be altered appropriately to adjust the quality of the bulk i-layer, but such an alteration is accompanied by a change in the silane-based gas flow rate during deposition of the initial layer relative to the silane-based gas flow rate during deposition of the bulk i-layer. In this embodiment, the silane-based gas flow rate during deposition of the initial layer is typically not less than 20% and not more than 80%, preferably not less than 40% and not more than 80%, and more preferably not less than 50% an not more than 70%, of the silane-based gas flow rate during deposition of the bulk i-layer.

Furthermore, the silane-based gas flow rate during deposition of the initial layer may be set, on the basis of the variation over time in the SiH* emission intensity, to a flow rate that results in no observation of a rapid change in the emission intensity immediately following plasma generation. Provided the SiH* emission intensity during deposition of the initial layer is not more than 80% of the stabilized SiH* emission intensity during deposition of the bulk i-layer, a plasma stabilization effect is obtained during the deposition of the initial layer. However, if the silane-based gas flow rate is too low, then the quality of the initial layer deteriorates, causing a deterioration in performance. Accordingly, the SiH* emission intensity during deposition of the initial layer is preferably not less than 20% of the stabilized SiH* emission intensity during deposition of the bulk i-layer.

The setting of the silane-based gas flow rate for deposition of the initial layer may be adjusted periodically, for example, after deposition has been performed on a predetermined number of substrates. Alternatively, the setting of the silane-based gas flow rate for deposition of the initial layer may be adjusted for each formation of a crystalline silicon i-layer on a substrate, while monitoring the SiH* emission intensity.

The deposition apparatus described below can be used for controlling deposition of the crystalline silicon i-layer while monitoring the SiH* emission intensity.

The deposition apparatus (plasma-enhanced gyp apparatus) of this embodiment comprises a deposition chamber, a gas supply unit, an emission intensity measurement unit, and a gas flow rate control unit.

The gas supply unit is connected to the deposition chamber. The gas supply unit is composed of a silane-based gas supply unit and a $H_2$ gas supply unit and the like, and supplies raw material gases to the deposition chamber.

The emission intensity measurement unit measures the plasma emission intensity, and particularly the SiH* emission intensity, during deposition of the i-layer. The emission intensity measurement unit employs an optical emission spectrophotometer (OES) or the like. The emission intensity measurement unit may be provided at a single location inside the deposition chamber, or may be provided at a plurality of locations inside the deposition chamber to enable the emission intensity to be monitored at a plurality of points within the substrate plane.

The gas flow rate control unit adjusts the flow rate of the silane-based gas supplied to the deposition chamber from the silane-based gas supply unit.

The crystalline silicon i-layer is formed via the steps described below.

Settings for the deposition time and silane-based gas flow rate for the initial layer are input, into the gas flow rate control unit. These settings racy be derived from the relationship, determined in advance, between the silane-based gas flow rate and the SiH* emission intensity measured by the emission intensity measurement unit of the deposition apparatus. Further, a setting for the silane-based gas flow rate for the bulk i-layer is also input into the gas flow rate control unit.

The gas flow rate control unit introduces the silane based gas into the deposition chamber at the initial layer silane-based gas flow rate setting. At the same time, $H_2$ gas is also introduced at a preset flow rate. When a plasma is generated, the initial layer is formed on the substrate installed inside the deposition chamber.

The emission intensity measurement unit measures the SiH* emission intensity during deposition of the initial layer. The measured emission intensity data are transmitted to the gas flow rate control unit.

The gas flow rate control unit receives the SiH* emission intensity data, and compares the data with a reference value. If the measured SiH* emission intensity differs from the reference value, then the flow rate control unit adjusts the flow rate of the silane-based gas introduced into the deposition chamber. Specifically, if the SiH* emission intensity is larger than the reference value, then the silane-based gas flow rate is reduced. A lower limit may also be set for the SiH* emission intensity reference value, so that if the SiH* emission intensity is less than this lower limit, the gas flow rate control unit can increase the silane-based gas flow rate. Monitoring of the emission intensity and adjustment of the gas flow rate is continued until deposition of the initial layer is complete.

Once the preset initial layer deposition time has elapsed from the point immediately following plasma generation, the gas flow rate control unit increases the flow rate of the silane-based car being introduced into the deposition chamber to the silane-based gas flow rate setting for the bulk i-layer, and this flow rate is then maintained until the deposition is complete. This enables deposition of a bulk i-layer of predetermined thickness.

A solar cell of the present embodiment has a high-quality initial layer as a result of forming the initial layer at a lower silane-based gas flow rate than the bulk i-layer, and therefore the crystal growth with in the bulk i-layer is very favorable. In other words, a crystalline silicon i-layer of favorable crystallinity is formed. In particular, by employing the method of forming a crystalline silicon i-layer according to the present embodiment, fluctuations in the quality of the crystalline silicon i-layer within the substrate planer can be suppressed. As a result, fluctuations in the open-circuit voltage and the performance (output, conversion efficiency) within the substrate plane can be suppressed.

Although the above embodiment described a tandem-type solar cell as the solar cell, the present invention is not limited to this example. For example, the present invention can be similarly applied to single-type crystalline silicon solar cells and silicon-germanium solar cells containing microcrystalline silicon and the like, and also to other types of thin-film solar cells such as triple-type solar cells.

EXAMPLES

Example 1

Using a glass substrate having a surface area of 1.4 m×1.1 m, a tandem-type solar cell module of the structure illustrated in FIG. 1 was produced. Deposition of the photovoltaic layer was performed using a plasma-enhanced CVD method. The thicknesses of the various layers were 700 nm for the transparent electrode layer, 15 nm for the amorphous silicon p-layer, 250 nm for the amorphous silicon i-layer, 35 nm for the amorphous silicon n-layer, 20 nm for the crystalline silicon p-layer, 2,000 nm for the crystalline silicon i-layer, 15 nm for the crystalline silicon n-layer, and 350 nm for the back electrode layer (a zinc oxide film and a silver film). $SiH_4$ was used as the raw material gas during deposition of the photovoltaic layer.

Deposition of the crystalline silicon i-layer was performed under conditions including a reduced pressure atmosphere of 2,100 Pa, a substrate temperature of approximately 200° C., and a plasma generation frequency of 60 MHz. The $SiH_4$ gas flow rate and the $H_2$ gas flow rate were adjusted so as to achieve a deposition rate for the bulk i-layer of 2.0 nm/s. Deposition was performed with various values for the $SiH_4$ gas flow rate during formation of the initial layer and the initial layer deposition time.

Figure 6:
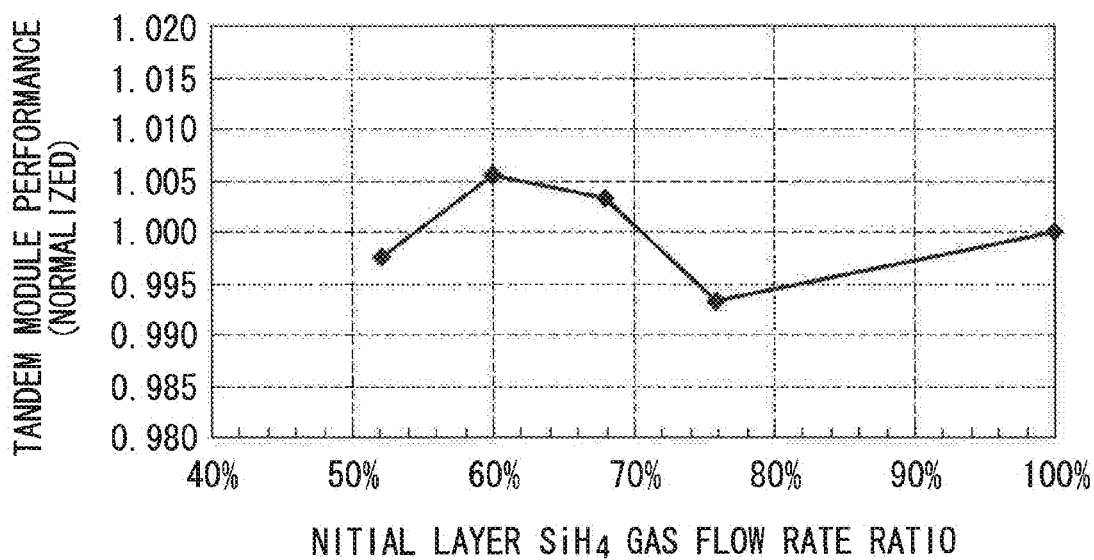
FIG. 6 A graph illustrating the relationship between the $SiH_4$ gas flow rate ratio and the performance of a tandem-type solar cell module.

FIG. 6 illustrates the relationship between the SiH$_4$ gas flow rate ratio (namely, [SiH$_4$ gas flow rate during initial layer deposition]/[SiH$_4$ gas flow rate during bulk i-layer deposition]) and the performance (output) of the tandem-type solar cell module. In this figure, the horizontal axis represents the SiH$_4$ gas flow rate ratio during initial layer formation, and the vertical axis represents the module performance relative to the case where the SiH$_4$ gas flow rate ratio is 100% (the case where the crystalline silicon i-layer is composed entirely of the bulk i-layer, namely, the case where no initial layer is provided).

For the solar cell module formed under the above conditions, setting the SiH$_4$ gas flow rate ratio to 60% yielded a 0.6% increase in the output relative to the case in which no initial layer was provided.

Figure 7:
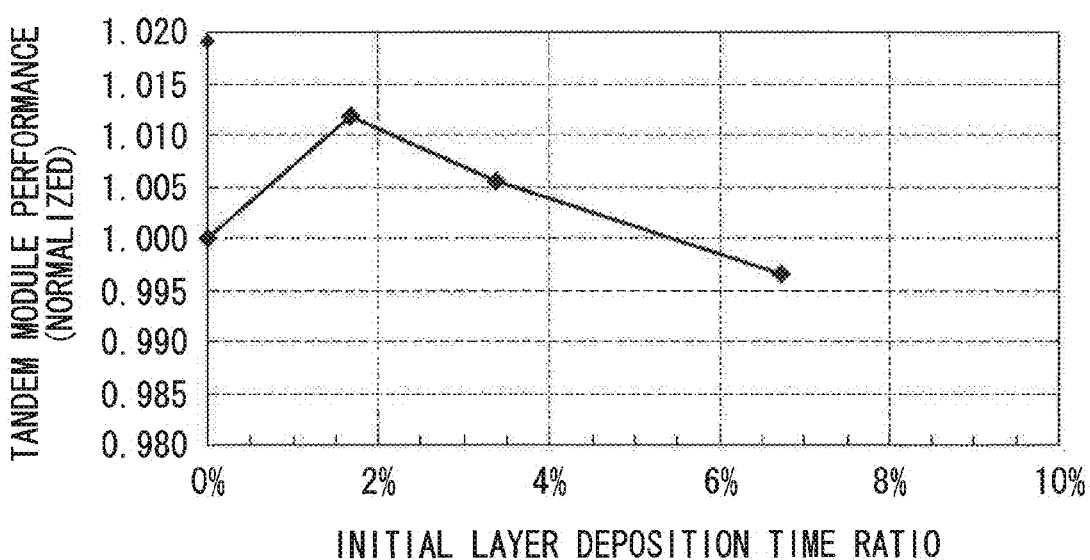
FIG. 7 A graph illustrating the relationship between the initial layer deposition time ratio and the performance of a tandem-type solar cell module.

FIG. 7 illustrates the relationship between the initial layer deposition time ratio (namely, [initial layer deposition time]/[bulk i-layer deposition time]) and the performance (output) of the tandem-type solar cell module. In this figure, the horizontal axis represents the initial layer deposition time ratio, and the vertical axis represents the module performance relative to the case where the initial layer deposition time ratio is 0% (namely, the case where no initial layer is provided).

For the solar cell module formed under the above conditions, setting the initial layer deposition time ratio to a value within a range from 1.7% to 3.4% yielded a high module output. In particular, setting the initial layer deposition time ratio to 1.7% yielded a 1.2% increase in the output relative to the case in which no initial layer was provided.

Figure 8:
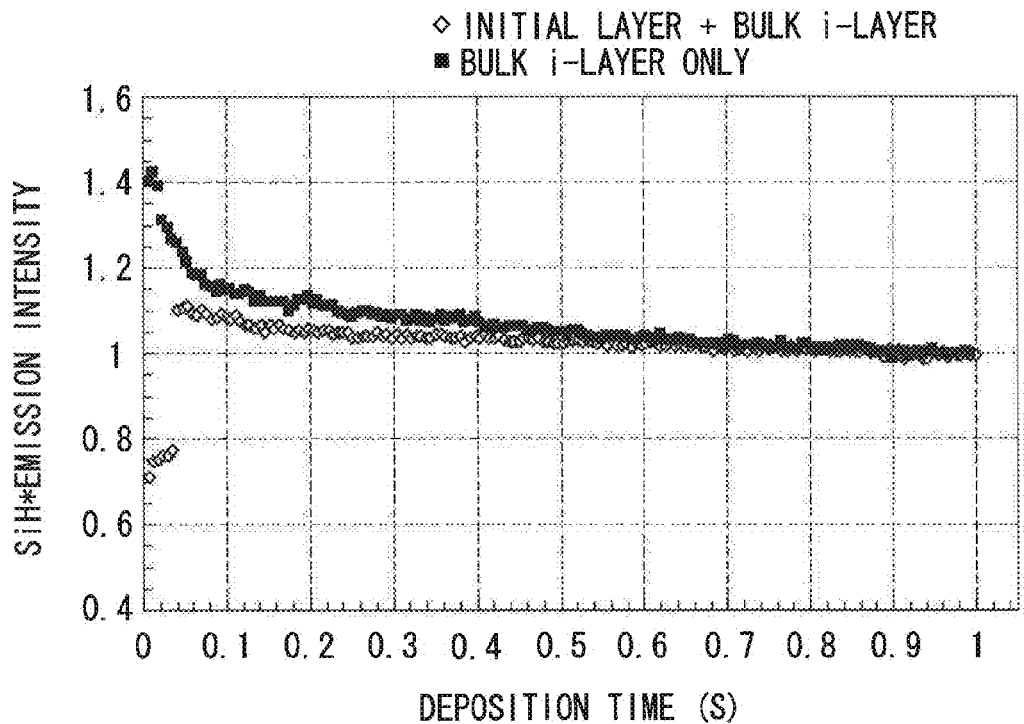
FIG. 8 A graph illustrating the change in the SiH* emission intensity for the case where an initial layer and a bulk layer are formed, and the case where only a bulk i-layer is formed.

FIG. 8 illustrates the change in the SiH* emission intensity for the case where an initial layer and a bulk layer were formed (initial layer deposition time ratio: 1.7%, SiH$_4$ gas flow rate ratio: 60%), and the case where only a bulk i-layer was formed. In this figure, the horizontal axis represents the deposition time, and the vertical axis represents the SiH* emission intensity (normalized relative to the average value of the SiH* emission intensity for the 30 seconds prior to completion of the deposition). In the case where only a bulk i-layer was formed, a rapid decrease in the SiH* emission intensity was measured during the initial deposition. In other words, it can be assumed that the plasma is unstable during the initial stage of deposition. In contrast, in the case where an initial layer and a bulk i-layer were formed, the fact that the SiH* emission intensity during the initial stage of deposition is low indicates that the plasma is stable.

Example 2

Using a glass substrate having a surface area of 1.4 m×1.1 m, a single-type solar cell was produced. Deposition of the photovoltaic layer was performed using a plasma-enhanced CVD method. The thicknesses of the various layers were 700 nm for the transparent electrode layer, 20 nm for the crystalline silicon p-layer, 2,000 nm for the crystalline silicon i-layer, 15 nm for the crystalline silicon n-layer, and 350 nm for the back electrode layer (a zinc oxide film and a silver film). SiH$_4$ was used as the raw material gas during deposition of the photovoltaic layer.

Deposition of the crystalline silicon i-layer was performed under conditions including a reduced pressure atmosphere of 2,100 Pa, a substrate temperature of approximately 200° C., and a plasma generation frequency of 60 MHz. The SiH$_4$ gas flow rate and the H$_2$ gas flow rate were adjusted so as to achieve a deposition rate for the bulk i-layer of 2.0 nm/s. The initial layer deposition time ratio was set to 1.8%, and the SiH$_4$ gas flow rate ratio during initial layer formation was set to 60%.

Comparative Example

With the exception of depositing the crystalline silicon i-layer using only the deposition conditions for the bulk i-layer, a single-type solar cell, similar to that of example 2 was produced.

The open-circuit voltage (Voc) and the cell efficiency for the solar cells of example 2 and the comparative example were measured at 24 points within the substrate plane. The cell performance was then evaluated in the manner described below.

50 mm square measurement samples were cut from 24 substantially equally spaced locations within the plane of each 1.4 m×1.1 m substrate. Using a laser processing device, the silicon layer and back electrode layer were removed to form separated cells, with each cell having a surface area of 8 mm×4 mm 15 of these 8 mm×4 mm cells were formed within each 50 mm square measurement sample.

The current-voltage property was evaluated for each cell. Evaluation of the current-voltage property was performed by bringing terminals into contact with the transparent electrode layer and the back electrode layer, and then irradiating simulated sunlight of AM (Air Mass) 1.5 and 100 mW/cm$^2$ through the glass substrate surface, while simultaneously sweeping the voltage.

The open-circuit voltage of the cell represents the voltage at which the current of the current-voltage property acquired in the manner described above becomes zero. The cell efficiency is the value obtained by determining the maximum value for the numerical product of the voltage and the current across each of the voltage values within the current-voltage property, multiplying this maximum value by the cell surface area, and then dividing the resulting product by the irradiation intensity (100 mW/cm$^2$).

Figure 9:
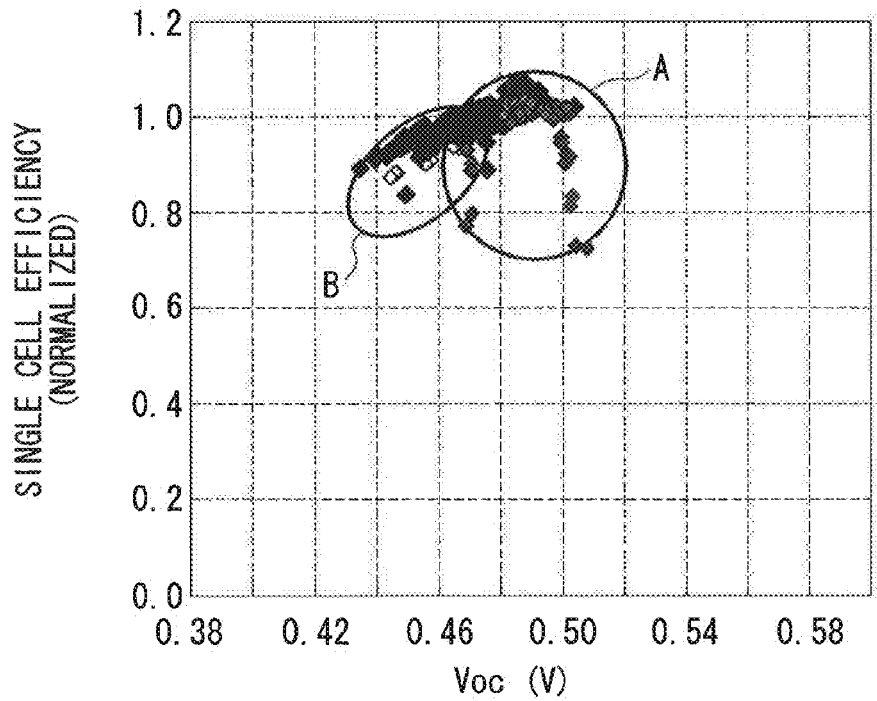
FIG. 9 A graph illustrating the relationship between the open-circuit voltage and the efficiency for single-type solar cells of example 2.
Figure 10:
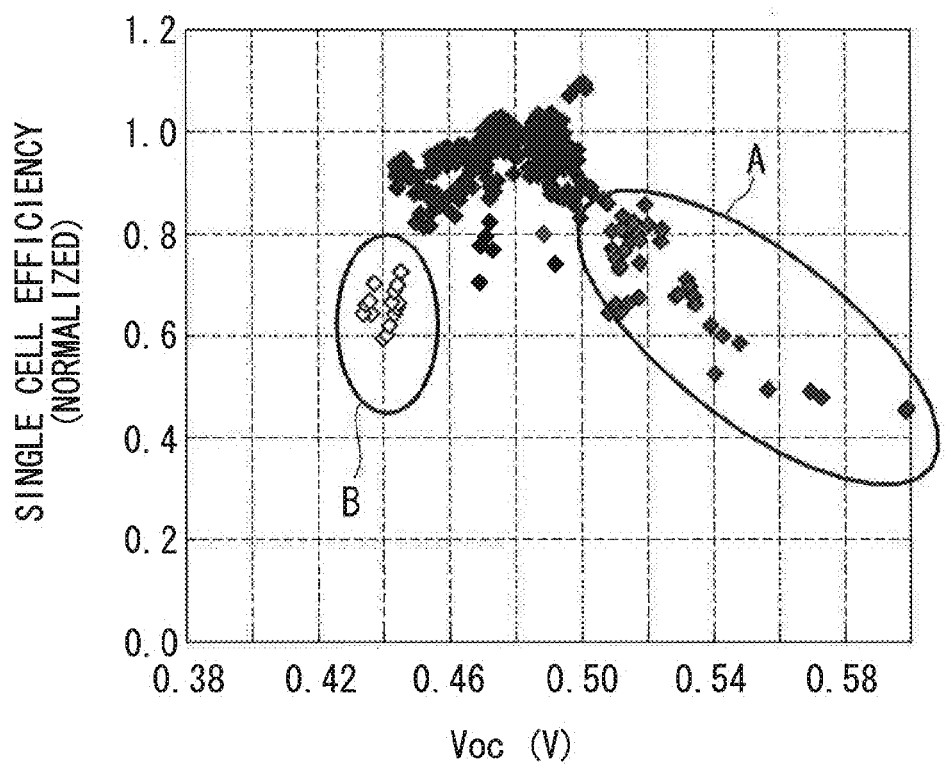
FIG. 10 A graph illustrating the relationship between the open-circuit voltage and the efficiency for single-type solar cells of a comparative example.

FIG. 9 Illustrates the relationship between the open-circuit voltage and the efficiency for the single-type solar cells of example 2. FIG. 10 illustrates the relationship between the open-circuit voltage and the efficiency for the single-type solar cells of the comparative example. In FIG. 9 and FIG. 10, the horizontal axis represents the open-circuit voltage and the vertical axis represents the normalized cell efficiency. The data points within the enclosed regions A and B in the figures correspond with the same locations within the substrate plane.

Figure 11:
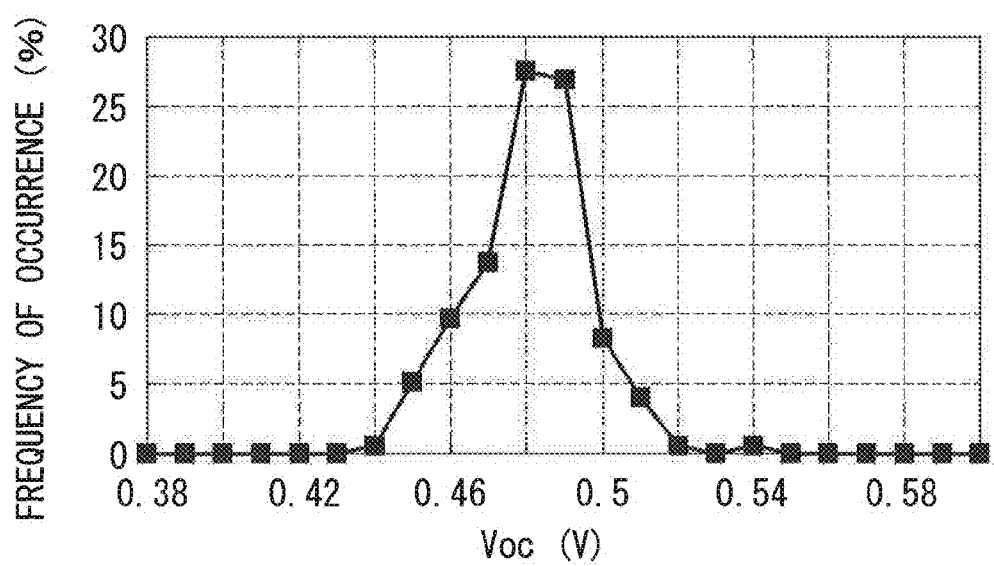
FIG. 11 A histogram of the open-circuit voltage for the solar cells of example 2.
Figure 12:
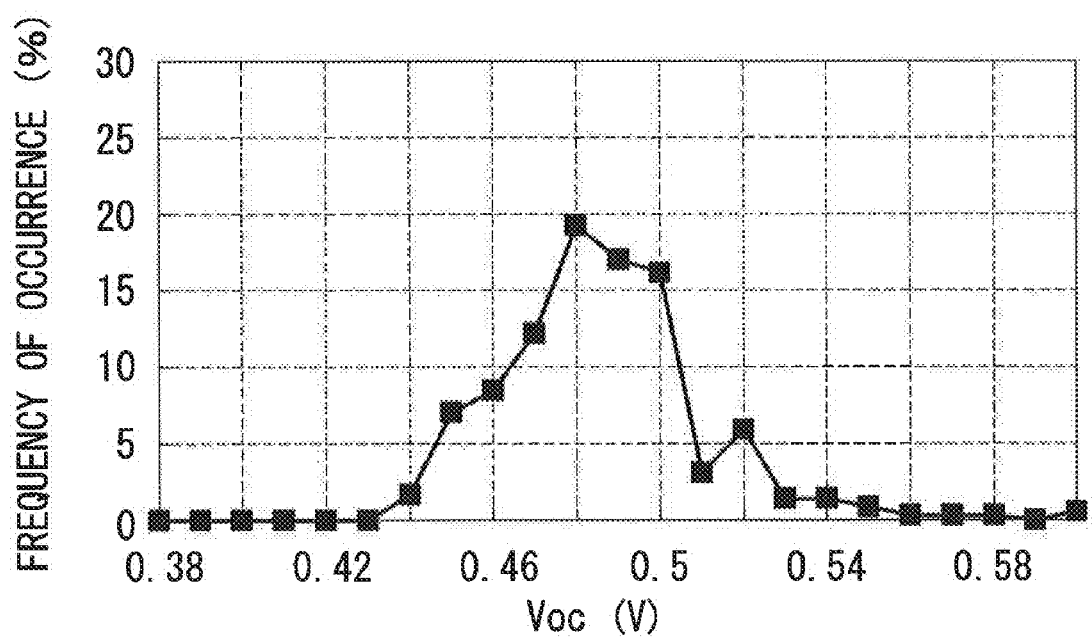
FIG. 12 A histogram of the open-circuit voltage for the solar cells of the comparative example.

FIG. 11 represents a histogram of the open-circuit voltage for the solar cells of example 2. FIG. 12 represents a histogram of the open-circuit voltage for the solar cells of the comparative example. In FIG. 11 and FIG. 12, the horizontal axis represents the open-circuit voltage and the vertical axis represents the frequency of occurrence.

In the comparative example, the cell efficiency deteriorated in regions where the open-circuit voltage was high (enclosed region A) and regions where the open-circuit voltage was low (enclosed region B). Further, as is evident from FIG. 10 and FIG. 12, the fluctuations in the open-circuit voltage and the cell efficiency win in the substrate plane were large. In contrast, the solar cells of example 2 exhibited an improved in-plane distribution for the open circuit voltage. Furthermore, the portions represented by the enclosed region A and the enclosed region B exhibited increased cell efficiency relative to the comparative example.

REFERENCE SIGNS LIST

1 Substrate
2 Transparent electrode lever

3 Photovoltaic layer
4 Back electrode layer
5 Intermediate contact layer
6 Solar cell, module
31 Amorphous silicon p-layer
32 Amorphous silicon i-layer
33 Amorphous silicon n-layer
41 Crystalline silicon p-layer
42 Crystalline silicon i-layer
43 Crystalline silicon n-layer
91 First cell layer
92 Second cell layer
100 Photovoltaic device

The invention claimed is:

1. A process for producing a photovoltaic device that comprises forming a crystalline silicon-based photovoltaic layer comprising an i-layer on a substrate using a plasma-enhanced CVD method, wherein
    formation of the i-layer comprises an initial layer deposition stage and a bulk i-layer deposition stage, and
    the initial layer deposition stage comprises
        depositing the initial layer using a silane-based gas flow rate during the initial layer deposition stage that is lower than a silane-based gas flow rate during the bulk i-layer deposition stage,
        with a deposition time for the initial layer deposition stage set to not less than 0.5% and not more than 20% of a total deposition time for the i-layer, and
        with an SiH* emission intensity during the initial layer deposition stage not more than 80% of a stabilized SiH* emission intensity during the bulk i-layer deposition stage.

2. The process for producing a photovoltaic device according to claim 1, wherein the initial layer is deposited with the silane-based gas flow rate during the initial layer deposition stage set to a value that is not less than 20% and not more than 80% of the silane-based gas flow rate during the bulk i-layer deposition stage.

3. The process for producing a photovoltaic device according to claim 1, wherein the i-layer is deposited under conditions including a reduced pressure atmosphere of not more than 3,000 Pa and a plasma generation frequency of not less than 40 MHz and not more than 100 MHz.

4. The process for producing a photovoltaic device according to claim 1, wherein a deposition rate for the bulk i-layer is not less than 1.5 nm/s.

5. The process for producing a photovoltaic device according to claim 1, the process comprising:
    forming a transparent electrode layer on the substrate,
    forming a first cell layer by sequentially stacking, on top of the transparent electrode layer, a p-layer, an i-layer and an n-layer containing mainly amorphous silicon,
    forming an intermediate contact layer containing mainly a transparent conductive oxide on top of the first cell layer,
    forming a second cell layer by sequentially stacking, on top of the intermediate contact layer, a p-layer, the i-layer and an n-layer containing mainly crystalline silicon, and
    forming a back electrode layer on top of the second cell layer.

6. The process for producing a photovoltaic device according to claim 1, wherein the substrate is a large surface area substrate of not less than 1 m².

7. A deposition apparatus that uses a plasma-enhanced CVD method to deposit a crystalline silicon-based photovoltaic layer comprising an i-layer composed of an initial layer and a bulk i-layer, the apparatus comprising, at least,
    a deposition chamber,
    a silane-based gas supply unit that supplies a silane-based gas to the deposition chamber,
    an emission intensity measurement unit that measures an SiH* emission intensity during deposition of the i-layer, and
    a gas flow rate control unit that controls a silane-based gas flow rate supplied from the silane-based gas supply unit so that an SiH* emission intensity during deposition of the initial layer as measured by the emission intensity measurement unit is not more than 80% of a stabilized SiH* emission intensity during deposition of the bulk i-layer as measured by the emission intensity measurement unit.

* * * * *